United States Patent
Diaz

(10) Patent No.: US 11,744,036 B2
(45) Date of Patent: Aug. 29, 2023

(54) COOLING SYSTEM FOR DOUBLE SIDED DISPLAY ASSEMBLY

(71) Applicant: Manufacturing Resources International, Inc., Alpharetta, GA (US)

(72) Inventor: Marcos Diaz, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 400 days.

(21) Appl. No.: 17/025,798

(22) Filed: Sep. 18, 2020

(65) Prior Publication Data

US 2021/0007241 A1 Jan. 7, 2021

Related U.S. Application Data

(63) Continuation of application No. 15/450,365, filed on Mar. 6, 2017, now Pat. No. 10,820,445.

(Continued)

(51) Int. Cl.
 *H05K 7/20* (2006.01)
 *B60R 11/02* (2006.01)
 *B60R 11/00* (2006.01)

(52) U.S. Cl.
 CPC ...... *H05K 7/20145* (2013.01); *B60R 11/0229* (2013.01); *H05K 7/20154* (2013.01); *H05K 7/20972* (2013.01); *B60R 2011/004* (2013.01)

(58) Field of Classification Search
 CPC .......... H05K 7/20145; H05K 7/20154; H05K 7/20972; B60R 11/0229; B60R 2011/004

(Continued)

(56) References Cited

U.S. PATENT DOCUMENTS

| 1,812,919 A | 7/1931 | Balder |
| 3,510,973 A | 5/1970 | Mazzocco, Sr. |

(Continued)

FOREIGN PATENT DOCUMENTS

| AU | 2011248190 B2 | 5/2011 |
| AU | 2014287438 B2 | 1/2018 |

(Continued)

OTHER PUBLICATIONS

Mentley, David E., State of Flat-Panel Display Technology and Future Trends, Proceedings of the IEEE, Apr. 2002, vol. 90, No. 4, pp. 453-459.

(Continued)

*Primary Examiner* — Anatoly Vortman
*Assistant Examiner* — Zhengfu J Feng
(74) *Attorney, Agent, or Firm* — STANDLEY LAW GROUP LLP; Jeffrey S. Standley; Adam J. Smith

(57) ABSTRACT

A rooftop mounted display assembly includes a first and second electronic display located at a housing for mounting to a roof of a vehicle. Apertures are vertically spaced apart along either end of thermal plates located behind the electronic displays. Fan(s), when activated, force ambient air through an inlet aperture located at a proximal end of the housing, the apertures at a first end of the thermal plates, channels located between the thermal plates and the electronic displays, the apertures at a second end of the thermal plates, and an exhaust aperture at a distal end of the housing.

18 Claims, 6 Drawing Sheets

Related U.S. Application Data

(60) Provisional application No. 62/303,806, filed on Mar. 4, 2016.

(58) Field of Classification Search
USPC .......................................................... 361/692
See application file for complete search history.

(56) References Cited

U.S. PATENT DOCUMENTS

| | | | |
|---|---|---|---|
| 4,093,355 A | 6/1978 | Kaplit et al. | |
| 4,327,803 A | 5/1982 | Muellejans et al. | |
| 4,488,193 A | 12/1984 | Davis et al. | |
| 4,593,978 A | 6/1986 | Mourey et al. | |
| 4,634,225 A | 1/1987 | Haim et al. | |
| 4,748,765 A | 6/1988 | Martin | |
| 4,763,993 A | 8/1988 | Vogeley et al. | |
| 4,921,041 A | 5/1990 | Akachi | |
| 4,952,783 A | 8/1990 | Aufderheide et al. | |
| 4,952,925 A | 8/1990 | Haastert | |
| 5,002,118 A | 3/1991 | Olmstead et al. | |
| 5,029,982 A | 7/1991 | Nash | |
| 5,088,806 A | 2/1992 | McCartney et al. | |
| 5,132,666 A * | 7/1992 | Fahs ................... | B60Q 1/503 340/472 |
| 5,247,374 A | 9/1993 | Terada | |
| 5,282,114 A | 1/1994 | Stone | |
| 5,285,677 A | 2/1994 | Oehler | |
| 5,293,930 A | 3/1994 | Pitasi | |
| 5,351,176 A | 9/1994 | Smith et al. | |
| 5,432,526 A | 7/1995 | Hyatt | |
| 5,535,816 A | 7/1996 | Ishida | |
| 5,559,614 A | 9/1996 | Urbish et al. | |
| 5,621,614 A | 4/1997 | O'Neill | |
| 5,657,641 A | 8/1997 | Cunningham et al. | |
| 5,748,269 A | 5/1998 | Harris et al. | |
| 5,765,743 A | 6/1998 | Sakiura et al. | |
| 5,767,489 A | 6/1998 | Ferrier | |
| 5,808,418 A | 9/1998 | Pitman et al. | |
| 5,818,010 A | 10/1998 | McCann | |
| 5,818,694 A | 10/1998 | Daikoku et al. | |
| 5,835,179 A | 11/1998 | Yamanaka | |
| 5,864,465 A | 1/1999 | Liu | |
| 5,869,818 A | 2/1999 | Kim | |
| 5,869,919 A | 2/1999 | Sato et al. | |
| 5,903,433 A | 5/1999 | Gudmundsson | |
| 5,991,153 A | 11/1999 | Heady et al. | |
| 6,003,015 A | 12/1999 | Kang et al. | |
| 6,007,205 A | 12/1999 | Fujimori | |
| 6,043,979 A | 3/2000 | Shim | |
| 6,089,751 A | 7/2000 | Conover et al. | |
| 6,104,451 A | 8/2000 | Matsuoka et al. | |
| 6,125,565 A | 10/2000 | Hillstrom | |
| 6,157,432 A | 12/2000 | Helbing | |
| 6,181,070 B1 | 1/2001 | Dunn et al. | |
| 6,191,839 B1 | 2/2001 | Briley et al. | |
| 6,198,222 B1 | 3/2001 | Chang | |
| 6,211,934 B1 | 4/2001 | Habing et al. | |
| 6,215,655 B1 | 4/2001 | Heady et al. | |
| 6,244,333 B1 | 6/2001 | Bergh et al. | |
| 6,351,381 B1 | 2/2002 | Bilski et al. | |
| 6,359,390 B1 | 3/2002 | Nagai | |
| 6,392,727 B1 | 5/2002 | Larson et al. | |
| 6,417,900 B1 | 7/2002 | Shin et al. | |
| 6,428,198 B1 | 8/2002 | Saccomanno et al. | |
| 6,437,673 B1 | 8/2002 | Nishida et al. | |
| 6,473,150 B1 | 10/2002 | Takushima et al. | |
| 6,476,883 B1 | 11/2002 | Salimes et al. | |
| 6,493,440 B2 | 12/2002 | Gromatsky et al. | |
| 6,504,713 B1 | 1/2003 | Pandolfi et al. | |
| 6,535,266 B1 | 3/2003 | Nemeth et al. | |
| 6,628,355 B1 | 9/2003 | Takahara | |
| 6,643,130 B1 | 11/2003 | DeMarchis et al. | |
| 6,683,639 B2 | 1/2004 | Driessen-Olde Scheper et al. | |
| 6,701,143 B1 | 3/2004 | Dukach et al. | |
| 6,714,410 B2 | 3/2004 | Wellhofer | |
| 6,727,468 B1 | 4/2004 | Nemeth | |
| 6,742,583 B2 | 6/2004 | Tikka | |
| 6,812,851 B1 | 11/2004 | Dukach et al. | |
| 6,825,828 B2 | 11/2004 | Burke et al. | |
| 6,833,992 B2 | 12/2004 | Kusaka et al. | |
| 6,839,104 B2 | 1/2005 | Taniguchi et al. | |
| 6,850,209 B2 | 2/2005 | Mankins et al. | |
| 6,885,412 B2 | 4/2005 | Ohnishi et al. | |
| 6,886,942 B2 | 5/2005 | Okada et al. | |
| 6,891,135 B2 | 5/2005 | Pala et al. | |
| 6,909,486 B2 | 6/2005 | Wang et al. | |
| 6,943,768 B2 | 9/2005 | Cavanaugh et al. | |
| 6,961,108 B2 | 11/2005 | Wang et al. | |
| 7,015,470 B2 | 3/2006 | Faytlin et al. | |
| 7,052,152 B2 | 5/2006 | Harbers et al. | |
| 7,059,757 B2 | 6/2006 | Shimizu | |
| 7,083,285 B2 | 8/2006 | Hsu et al. | |
| 7,157,838 B2 | 1/2007 | Thielemans et al. | |
| 7,161,803 B1 | 1/2007 | Heady | |
| 7,190,416 B2 | 3/2007 | Paukshto et al. | |
| 7,190,587 B2 | 3/2007 | Kim et al. | |
| 7,209,349 B2 | 4/2007 | Chien et al. | |
| 7,212,403 B2 | 5/2007 | Rockenfeller | |
| 7,259,964 B2 | 8/2007 | Yamamura et al. | |
| 7,269,023 B2 | 9/2007 | Nagano | |
| 7,284,874 B2 | 10/2007 | Jeong et al. | |
| 7,324,080 B1 | 1/2008 | Hu et al. | |
| 7,396,145 B2 | 7/2008 | Wang et al. | |
| 7,447,018 B2 | 11/2008 | Lee et al. | |
| 7,452,121 B2 | 11/2008 | Cho et al. | |
| 7,457,113 B2 | 11/2008 | Kumhyr et al. | |
| 7,480,140 B2 | 1/2009 | Hara et al. | |
| 7,518,864 B2 | 4/2009 | Kimura | |
| 7,535,543 B2 | 5/2009 | Dewa et al. | |
| 7,591,508 B2 | 9/2009 | Chang | |
| 7,602,469 B2 | 10/2009 | Shin | |
| D608,775 S | 1/2010 | Leung | |
| 7,667,964 B2 | 2/2010 | Kang et al. | |
| 7,682,047 B2 | 3/2010 | Hsu et al. | |
| 7,752,858 B2 | 7/2010 | Johnson et al. | |
| 7,753,567 B2 | 7/2010 | Kang et al. | |
| 7,762,707 B2 | 7/2010 | Kim et al. | |
| 7,800,706 B2 | 9/2010 | Kim et al. | |
| 7,813,124 B2 | 10/2010 | Karppanen | |
| 7,903,416 B2 | 3/2011 | Chou | |
| D635,614 S | 4/2011 | Yan | |
| 7,995,342 B2 | 8/2011 | Nakamichi et al. | |
| 8,004,648 B2 | 8/2011 | Dunn | |
| 8,035,968 B2 | 10/2011 | Kwon et al. | |
| 8,081,465 B2 | 12/2011 | Nishiura | |
| 8,102,173 B2 | 1/2012 | Merrow | |
| 8,142,027 B2 | 3/2012 | Sakai | |
| D657,421 S | 4/2012 | Yan | |
| D657,422 S | 4/2012 | Yan | |
| 8,208,115 B2 | 6/2012 | Dunn | |
| 8,223,311 B2 | 7/2012 | Kim et al. | |
| 8,241,573 B2 | 8/2012 | Banerjee et al. | |
| 8,248,784 B2 | 8/2012 | Nakamichi et al. | |
| 8,254,121 B2 | 8/2012 | Lee et al. | |
| 8,269,916 B2 | 9/2012 | Ohkawa | |
| 8,270,163 B2 | 9/2012 | Nakamichi et al. | |
| 8,274,622 B2 | 9/2012 | Dunn | |
| 8,274,789 B2 | 9/2012 | Nakamichi et al. | |
| D669,938 S | 10/2012 | Lard et al. | |
| 8,300,203 B2 | 10/2012 | Nakamichi et al. | |
| 8,310,824 B2 | 11/2012 | Dunn et al. | |
| 8,320,119 B2 | 11/2012 | Isoshima et al. | |
| 8,351,014 B2 | 1/2013 | Dunn | |
| 8,358,397 B2 | 1/2013 | Dunn | |
| 8,369,083 B2 | 2/2013 | Dunn et al. | |
| 8,373,841 B2 | 2/2013 | Dunn | |
| 8,379,182 B2 | 2/2013 | Dunn | |
| 8,400,608 B2 | 3/2013 | Takahashi et al. | |
| 8,472,174 B2 | 6/2013 | Idems et al. | |
| 8,472,191 B2 | 6/2013 | Yamamoto et al. | |
| 8,482,695 B2 | 7/2013 | Dunn | |
| 8,497,972 B2 | 7/2013 | Dunn et al. | |
| 8,590,602 B2 | 11/2013 | Fernandez | |
| 8,649,170 B2 | 2/2014 | Dunn et al. | |

(56) References Cited

U.S. PATENT DOCUMENTS

| | | |
|---|---|---|
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| D704,265 S | 5/2014 | Yan |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,861,007 B2 | 1/2018 | Yoon et al. |
| 9,894,800 B2 | 2/2018 | Dunn |
| 10,080,316 B2 | 9/2018 | Dunn et al. |
| 10,088,702 B2 | 10/2018 | Dunn et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,757,844 B2 | 8/2020 | Dunn et al. |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0122134 A1 | 9/2002 | Kalua |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0269216 A1 | 11/2006 | Wiemeyer et al. |
| 2006/0283579 A1 | 12/2006 | Ghosh et al. |

(56) References Cited

U.S. PATENT DOCUMENTS

| | | |
|---|---|---|
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |
| 2008/0055534 A1 | 3/2008 | Kawano |
| 2008/0076342 A1 | 3/2008 | Bryant et al. |
| 2008/0083527 A1 | 4/2008 | Horng et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1* | 5/2009 | Dunn ............. H05K 7/20972 349/161 |
| 2009/0145581 A1 | 6/2009 | Hoffman et al. |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1* | 4/2011 | Nakamichi ........ H05K 7/20972 361/695 |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1* | 1/2012 | Dunn ............... G02F 1/133385 165/104.34 |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1* | 10/2013 | Dunn ................ H05K 7/20154 362/97.3 |
| 2013/0294039 A1 | 11/2013 | Chao |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1* | 1/2015 | Dunn ................ G02F 1/133382 361/695 |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |

(56) References Cited

U.S. PATENT DOCUMENTS

| | | |
|---|---|---|
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0116073 A1 | 4/2018 | Dunn |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0037738 A1 | 1/2019 | Dunn et al. |
| 2019/0089176 A1 | 3/2019 | Dunn et al. |
| 2019/0133002 A1 | 5/2019 | Dunn et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2020/0154597 A1 | 5/2020 | Dunn et al. |
| 2020/0163235 A1 | 5/2020 | Dunn |
| 2020/0205303 A1 | 6/2020 | Dunn et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0390009 A1 | 12/2020 | Whitehead et al. |
| 2021/0165472 A1 | 6/2021 | Chin |
| 2021/0304644 A1 | 9/2021 | Webster |

FOREIGN PATENT DOCUMENTS

| | | |
|---|---|---|
| AU | 2015253128 B2 | 3/2018 |
| AU | 2017216500 B2 | 10/2018 |
| AU | 2017216500 B2 | 1/2019 |
| AU | 2015229457 B2 | 3/2019 |
| AU | 2016220308 B2 | 3/2019 |
| AU | 2017228430 B2 | 3/2020 |
| BR | PI0820231-1 | 2/2019 |
| CA | 2705814 C | 2/2018 |
| CA | 2947524 C | 4/2018 |
| CA | 2915261 C | 8/2018 |
| CA | 27982777 C | 6/2019 |
| CA | 2809019 C | 9/2019 |
| CA | 2888494 C | 9/2019 |
| CN | 2702363 Y | 5/2005 |
| CN | 107251671 A | 10/2017 |
| CN | 108700739 A | 10/2018 |
| CN | 107251671 B | 8/2019 |
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| EP | 3259968 A1 | 12/2017 |
| EP | 3423886 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | H8-54834 A | 2/1996 |
| JP | 8115788 A | 5/1996 |
| JP | H8-152604 A | 6/1996 |
| JP | 8194437 A | 7/1996 |
| JP | H08-305301 A | 11/1996 |
| JP | 8339034 A | 12/1996 |
| JP | H09246766 A | 9/1997 |
| JP | H11-68363 A | 3/1999 |
| JP | 11160727 A | 6/1999 |
| JP | H11296094 A | 10/1999 |
| JP | 2000-10501 A | 1/2000 |
| JP | 3118907 B2 | 10/2000 |
| JP | 2001209126 A | 8/2001 |
| JP | 2002-6282 A | 1/2002 |
| JP | 2002158475 A | 5/2002 |
| JP | 2003-162228 A | 6/2003 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006-32890 A | 2/2006 |
| JP | 2006513577 A | 4/2006 |
| JP | 2007322718 A | 5/2006 |
| JP | 2006148047 A | 6/2006 |
| JP | 2006163217 A | 6/2006 |
| JP | 2006-176112 A | 7/2006 |
| JP | 2006-330196 A | 12/2006 |
| JP | 2007003638 A | 1/2007 |
| JP | 2007-293105 A | 11/2007 |
| JP | 09307257 A | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| KR | 20000000118 U | 1/2000 |
| KR | 20000047899 A | 7/2000 |
| KR | 10-2067751 B1 | 1/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |

(56) References Cited

FOREIGN PATENT DOCUMENTS

| | | |
|---|---|---|
| KR | 20060016469 A | 2/2006 |
| KR | 10-0563049 B1 | 3/2006 |
| KR | 10-2006-0070176 A | 6/2006 |
| KR | 100666961 B1 | 1/2007 |
| KR | 1020070070675 A | 4/2007 |
| KR | 1020070048294 | 8/2007 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| RU | 2513043 C2 | 4/2014 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016102982 A1 | 6/2016 |
| WO | WO2016127613 A1 | 8/2016 |
| WO | WO2016133852 A1 | 8/2016 |
| WO | 2017152166 A1 | 9/2017 |
| WO | WO2018/200260 A1 | 11/2018 |
| WO | WO2018/200905 A1 | 11/2018 |
| WO | WO2020/081687 A1 | 4/2020 |

OTHER PUBLICATIONS

Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC.* v *Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC.* v *Manufacturing Resources International, Inc.*, Defendant's Amended Answer and Countercliams to Plaintiff's First Amended Complaint, Filed Apr. 24, 2018, 240 pages.
Miller, Adnation, photos, May 9, 2017, 28 pages.
ItsenClosures, Product Catalog, 2009, 48 pages.
ItsenClosures, Standard Product Data Sheet, 2011, 18 pages.
SunBriteTV, All Weather Outdoor LCD Television Model 4610HD, 2008, 1 page.
SunBriteTV, Introduces Two New All-Weather Outdoor Televisions InfoComm 2008, 7 pages.
ItsenClosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
AdNation,Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A-Appendix D, Jan. 24, 2018, 51 pages.
Civiq, Invalidity Contentions, Jan. 24, 2018, 51 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC* v. *Manufacturing Resources International, Inc.*, Memorandum Opinion re claim construction, Sep. 27, 2018, 16 pages.
*Civiq Smartscapes, LLC* v. *Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.
*Civiq Smartscapes, LLC* v. *Manufacturing Resources International, Inc.*, Memorandum Order re "rear surface of the electronic display" term construction, Mar. 5, 2019, 3 pages.

\* cited by examiner

COOLING SYSTEM FOR DOUBLE SIDED DISPLAY ASSEMBLY

CROSS REFERENCE TO RELATED APPLICATIONS

The application is a continuation of U.S. patent application Ser. No. 15/450,365 filed Mar. 6, 2017, which claims the benefit of U.S. Provisional Patent Application No. 62/303,806 filed on Mar. 4, 2016, the disclosures of each of which are hereby incorporated by reference in their entireties.

TECHNICAL FIELD

Embodiments of the present invention generally relate to cooling systems for electronic displays.

BACKGROUND

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures.

SUMMARY OF THE INVENTIVE CONCEPT

Exemplary embodiments may comprise multiple separate flow paths for a fluid, such as air, through an electronic display housing. At least one path may be a closed loop and several other paths may provide open loops. The closed loop path preferably circulates through a sealed electronics compartment as well as pass between the electronic display(s) and a front transparent panel. A first open loop of ambient air may pass behind the first electronic display while a second path of ambient air may pass behind the second electronic display. In some embodiments the open loop air also removes heat from a thermal plate having electronic components and in some embodiments the open loop air also removes heat from an LED backlight (or LED display). The fans can be positioned so as to precisely control the amount of fluid travelling through each path.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Figure 1:
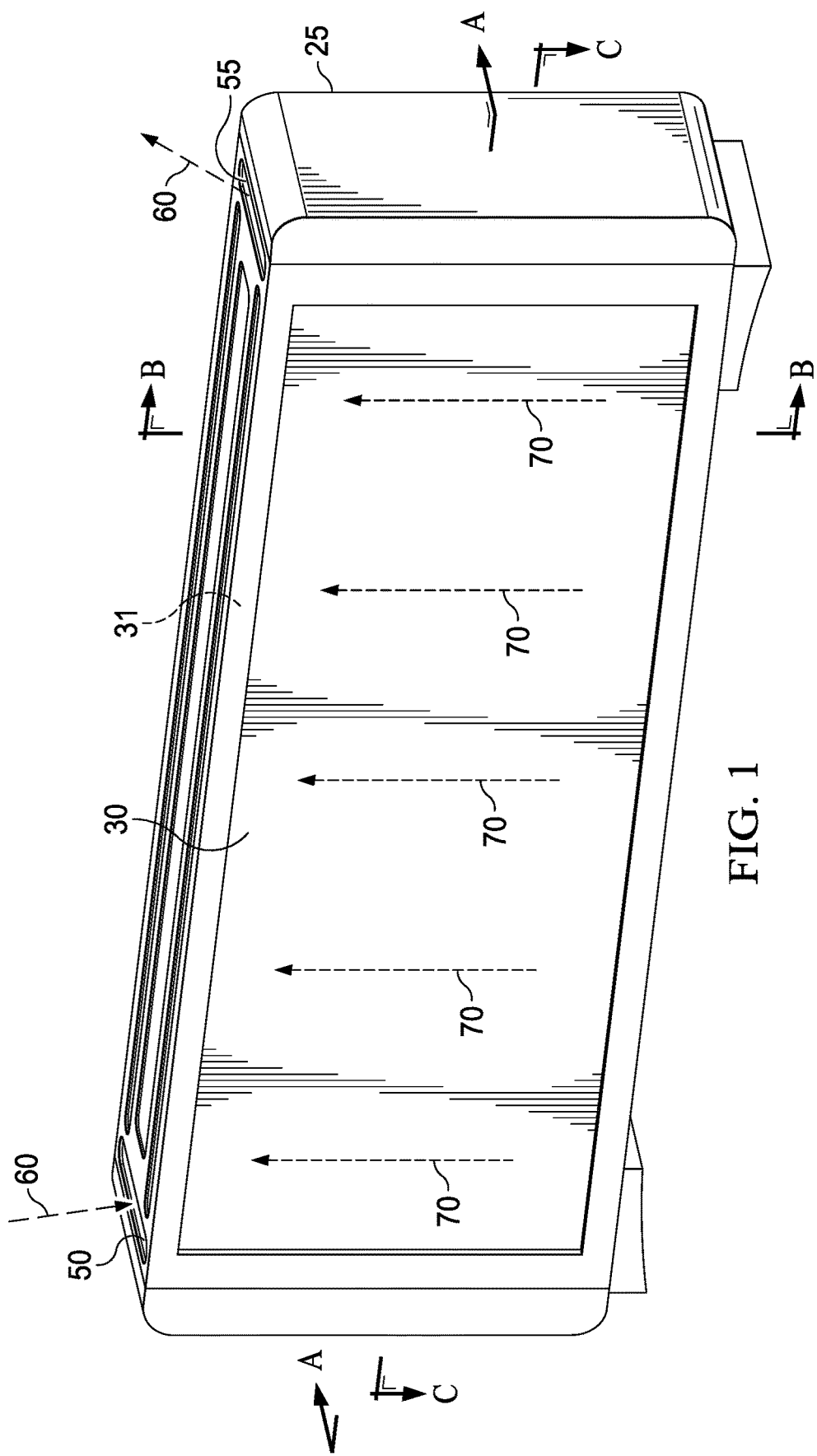
FIG. 1 is a front perspective view showing an exemplary embodiment of the double sided display assembly, as well as the location for section lines A-A, B-B, and C-C.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a front perspective view showing an exemplary embodiment of the double sided display assembly, as well as the location for section lines A-A, B-B, and C-C. Generally speaking, an exemplary embodiment includes two displays 30 and 31 positioned back to back and placed within a housing 25. An inlet aperture 50 accepts a flow of ambient air 60 into and through the housing 25. The ambient air 60 is preferably exhausted out of the housing 25 through the exhaust aperture 55. A closed loop flow of circulating gas 70 travels within the housing 25 as well, but preferably does not mix with the flow of ambient air 60 in any substantial manner.

As used herein, the term ambient air 60 simply refers to common atmospheric air that would provide the surrounding environment for the assembly. This ambient air 60 is known to contain a mixture of different types of gaseous elements, as well as dust, dirt, pollen, water vapor, and other particulate. Also as used herein, the term circulating gas 70 can refer to any gaseous matter, which might be a mixture of different types of gases or could be a pure gaseous matter.

Preferably, the circulating gas 70 does not contain substantial amounts of dust, dirt, pollen, or other types of particulate.

Exemplary embodiments of the present invention may be configured for mounting to a vehicle, preferably to the roof. The housing 25 may be sized and configured for fitting atop a vehicle roof. Further, the housing 25 may be sized and adapted to minimize aerodynamic drag. The housing 25 may comprise a pair of feet 26 for mounting the housing 25 to the vehicle. The feet 26 may be sized and configured to be secured to a vehicle's roof, or to be secured to internal supports placed on or within the vehicle. In such embodiments, the housing 25 is preferably thin and comprises rounded corners and other features to minimize aerodynamic drag. The housing 25 may comprise a variety of stiffening members to provide structural rigidity and strength to accommodate the forces caused by a moving vehicle. Likewise, the various components of the display assembly may be configured or comprised of a sufficiently rigid material so as to accommodate the forces caused by a moving vehicle. Furthermore, the housing and various components of the display assembly may be configured to withstand the forces, vibrations, and other rigors of being mounted to a vehicle. For example, but not to serve as a limitation, the feet 26 and other components of the display assembly may comprise rubber pads or other vibration and shock absorption devices.

As indicated in the figure, section line A-A is positioned horizontally down the center of the assembly and cuts through the assembly vertically. Section line B-B is oriented vertically and cuts through the assembly horizontally. Finally, section line C-C is oriented horizontally and cuts through the assembly horizontally as well. The section line arrows in FIG. 1 indicate the direction of hypothetical cut to obtain the section view.

Figure 2:
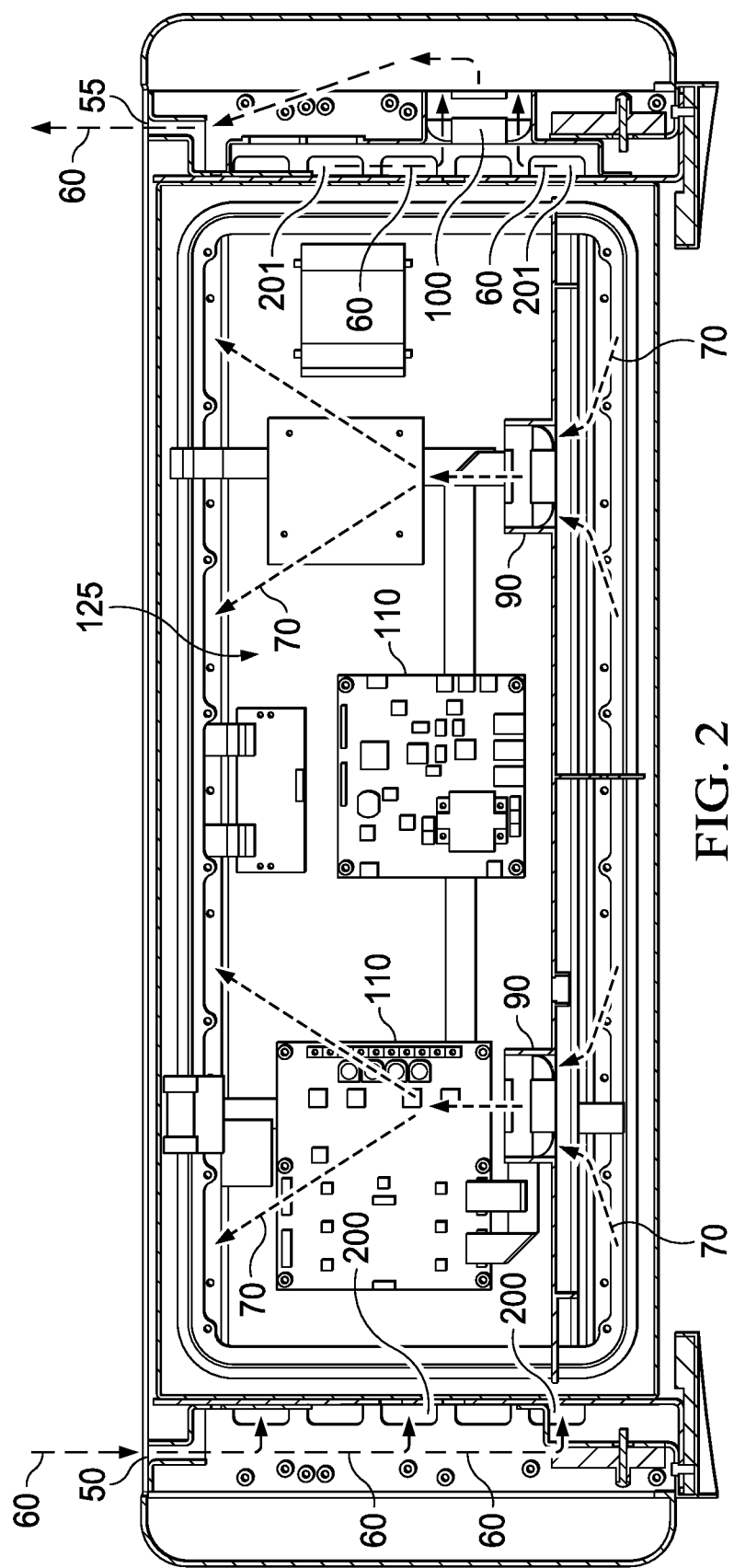
FIG. 2 is a side section view of the embodiment shown in FIG. 1, taken along the section line A-A.

FIG. 2 is a side section view of the embodiment shown in FIG. 1, taken along the section line A-A. The ambient air 60 may enter the housing 25 through the inlet aperture 50, where it may then be directed into an entrance plenum, and pass through one of a plurality of entrance apertures 200 which connect with the open loop channels (described further below). The ambient air 60 is preferably pulled by one or more fans 100, but the fans 100 could also be positioned to push the ambient air 60, or several fans could be used for a combination of push/pull. In this particular embodiment, the fan 100 is located near an exit plenum, where the ambient air 60 is collected from the open loop channels by travelling through one of a plurality of exit aperture 201, collected within the exit plenum, and directed out of the housing 25 through the exhaust aperture 55.

As will be described further below, the entrance apertures 200 and exit apertures 201 are in gaseous communication with a first open loop channel running behind the electronic display 31. There is preferably another set of entrance apertures and exit apertures on the opposite side of the assembly (not shown in this view), which communicate with a second open loop channel running behind the electronic display 30. The apertures 200 and 201 are preferably distributed across the width of the electronic display 30/31 in a substantially equidistant manner from one another. The apertures 200/201 allow the flow of ambient air 60 to pass through the housing 25 and the open loop channels without substantially mixing with the circulating gas 70 or entering the sealed electronics compartment 125.

A plurality of electronic components 110 are preferably placed within a sealed electronics compartment 125 which forms a part of the closed loop for the circulating gas 70. The electronic components 110 may comprise one or more of the following: power modules, video player, electronic data storage, microprocessor, satellite/wireless receiver/transmitter, and timing and control board. At least some of the electronic components 110 may be in electrical connection with the displays 30 and 31.

One or more fans 90 may force the closed loop of circulating gas 70 over the electronic components 110. While shown with two fans 90, this is not required. Additionally, while shown pushing the circulating gas 70 over the electronic components 110, this is not required as the fans 90 could also be positioned to pull the circulating gas 70, or several fans 90 could be used in a combination push/pull of the circulating gas 70.

Figure 3:
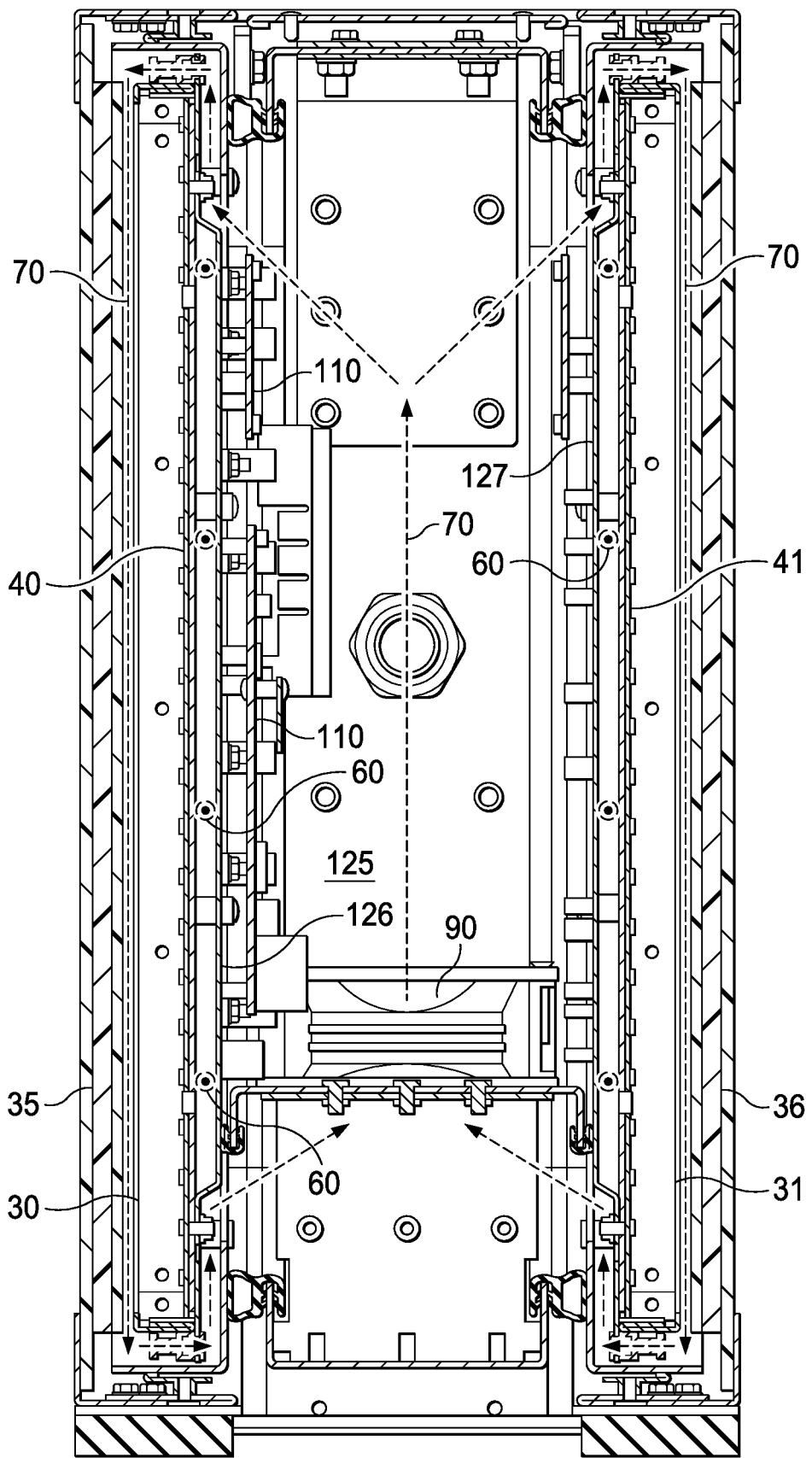
FIG. 3 is a front section view of the embodiment shown in FIG. 1, taken along the section line B-B.

FIG. 3 is a front section view of the embodiment shown in FIG. 1, taken along the section line B-B. Here, the closed loop of circulating gas 70 can be clearly shown. As mentioned above, the circulating gas 70 preferably travels over the electronic components 110 within the sealed electronics compartment 125 and then splits to wrap around each of the displays 30 and 31. Regarding the first display 30, a transparent panel 35 is preferably placed in front of the display 30 to define a closed loop channel between the display 30 and the transparent panel 35 for accepting circulating gas 70. Once the circulating gas 70 has travelled across the display 30, it is directed back in to the sealed electronics compartment 125 to begin the closed loop again.

Similarly, regarding the second display 31, a transparent panel 36 is preferably placed in front of the display 31 to define a closed loop channel between the display 31 and the transparent panel 36 for accepting circulating gas 70. Once the circulating gas 70 has travelled across the display 31, it is directed back in to the sealed electronics compartment 125 to begin the closed loop again.

As shown, the flow of ambient air 60 is preferably split into at least two channels, with one open loop channel travelling behind each display. Regarding display 30, a path of ambient air 60 preferably travels between the rear surface of the display 30 and a thermal wall 126 of the sealed electronics compartment 125. Although not required, when using a direct LED backlit LCD as the display 30, the ambient air 60 preferably travels between the rear surface of the LED backlight 40 and the thermal wall 126. As shown above, a plurality of electronic components 110 are preferably attached to (or near) one or both thermal walls 126 and 127. In this way, heat from the electronic components 110 may be transferred (preferably through conduction but some convection and radiation may occur as well) to the walls 126 and 127 and removed by the flow of ambient air 60.

Similarly regarding display 31, a path of ambient air 60 preferably travels between the rear surface of the display 31 and a thermal wall 127 of the sealed electronics compartment 125. Although not required, when using a direct LED backlit LCD as the display 31, the ambient air 60 preferably travels between the rear surface of the LED backlight 41 and the thermal wall 127. It should be expressly noted that although a direct LED backlit LCD is shown in these embodiments, this type of display and its associated backlight is not necessary for every embodiment. The displays 30 and 31 could be any one of the following: plasma, OLED, LCD (direct lit or edge lit), LED, and any type of electroluminescent polymer display.

Figure 4:
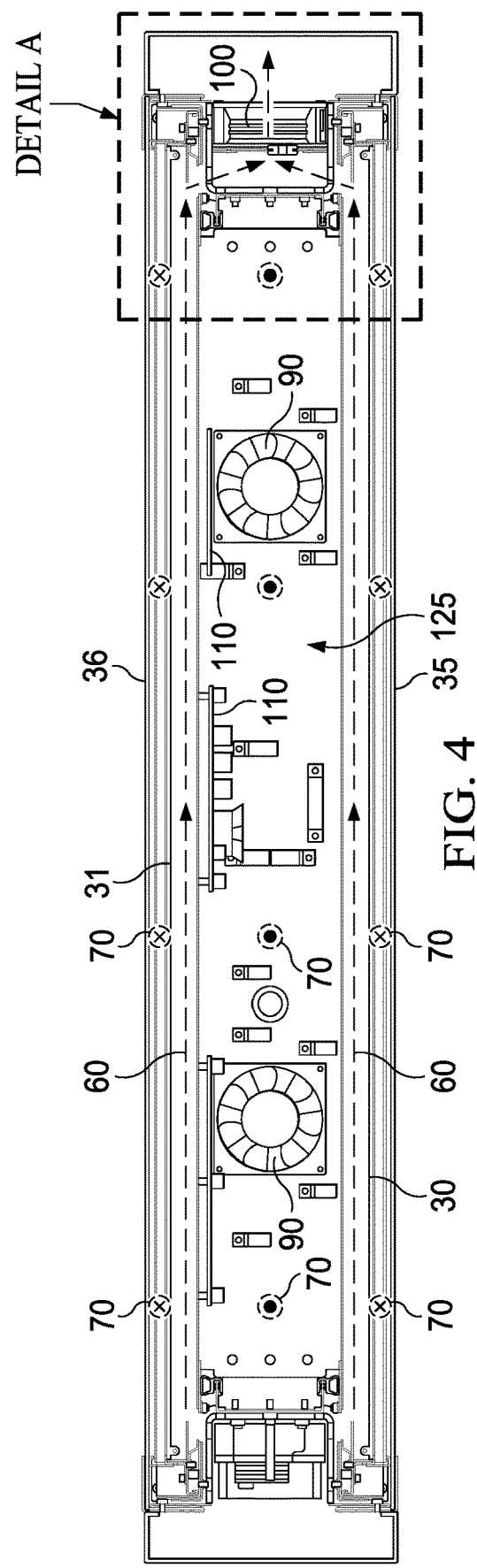
FIG. 4 is a top section view of the embodiment shown in FIG. 1, taken along the section line C-C and indicating the location for Detail A.

FIG. 4 is a top section view of the embodiment shown in FIG. 1, taken along the section line C-C and indicating the location for Detail A. In this figure, the two channels for ambient air 60 behind each of the displays 30 and 31 can be seen. Again, preferably the two paths of ambient air 60 can remove heat from the electronic displays 30 and 31 as well as the electronics 110 (through the thermal walls 126 and 127).

Figure 5:
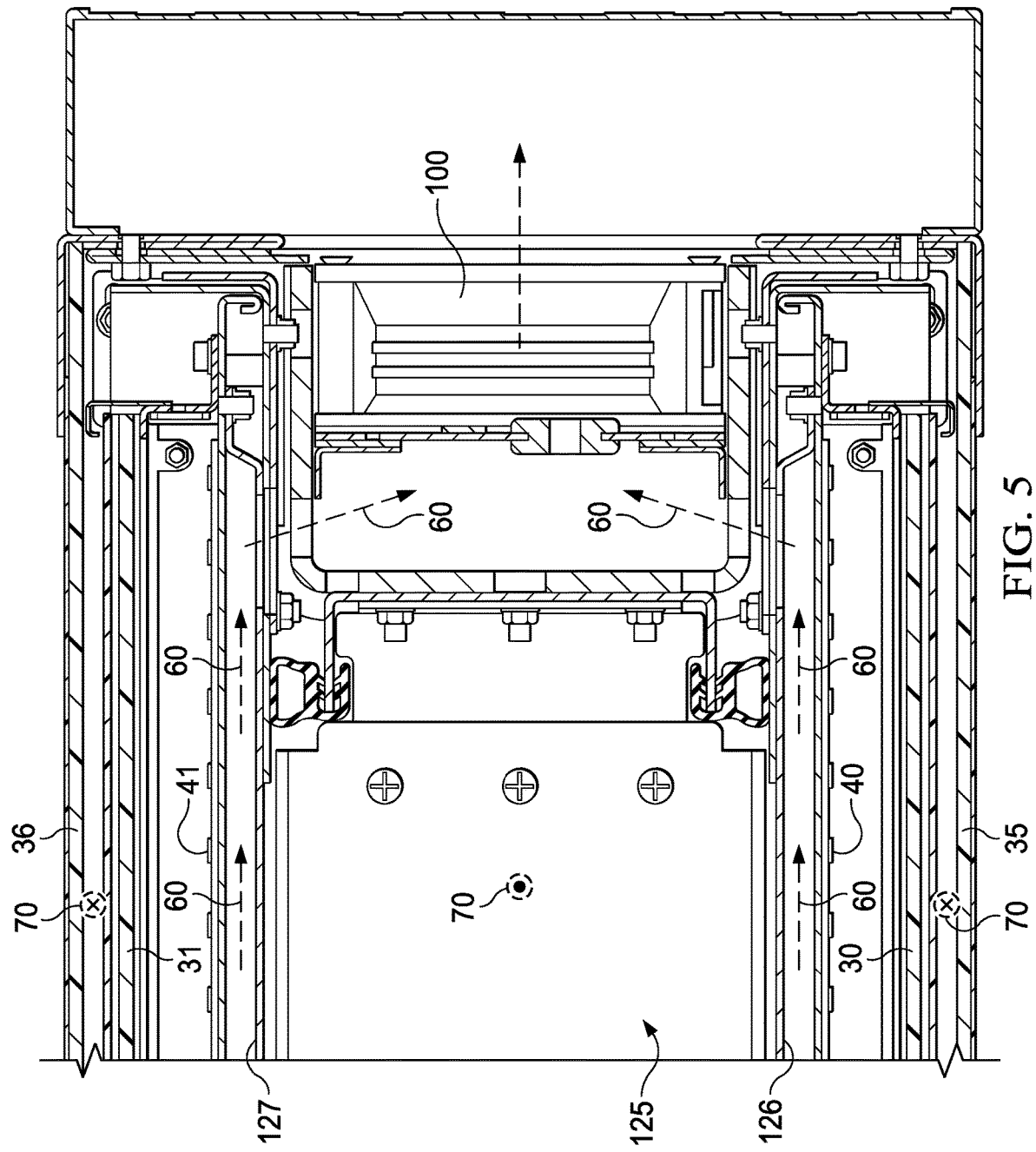
FIG. 5 is a detailed section view of Detail A.

FIG. 5 is a detailed section view of Detail A. Once the ambient air 60 has travelled through each of the open loop channels, it can be gathered by the exit plenum and forced out of the display housing 25 by the fan 100.

Figure 6:
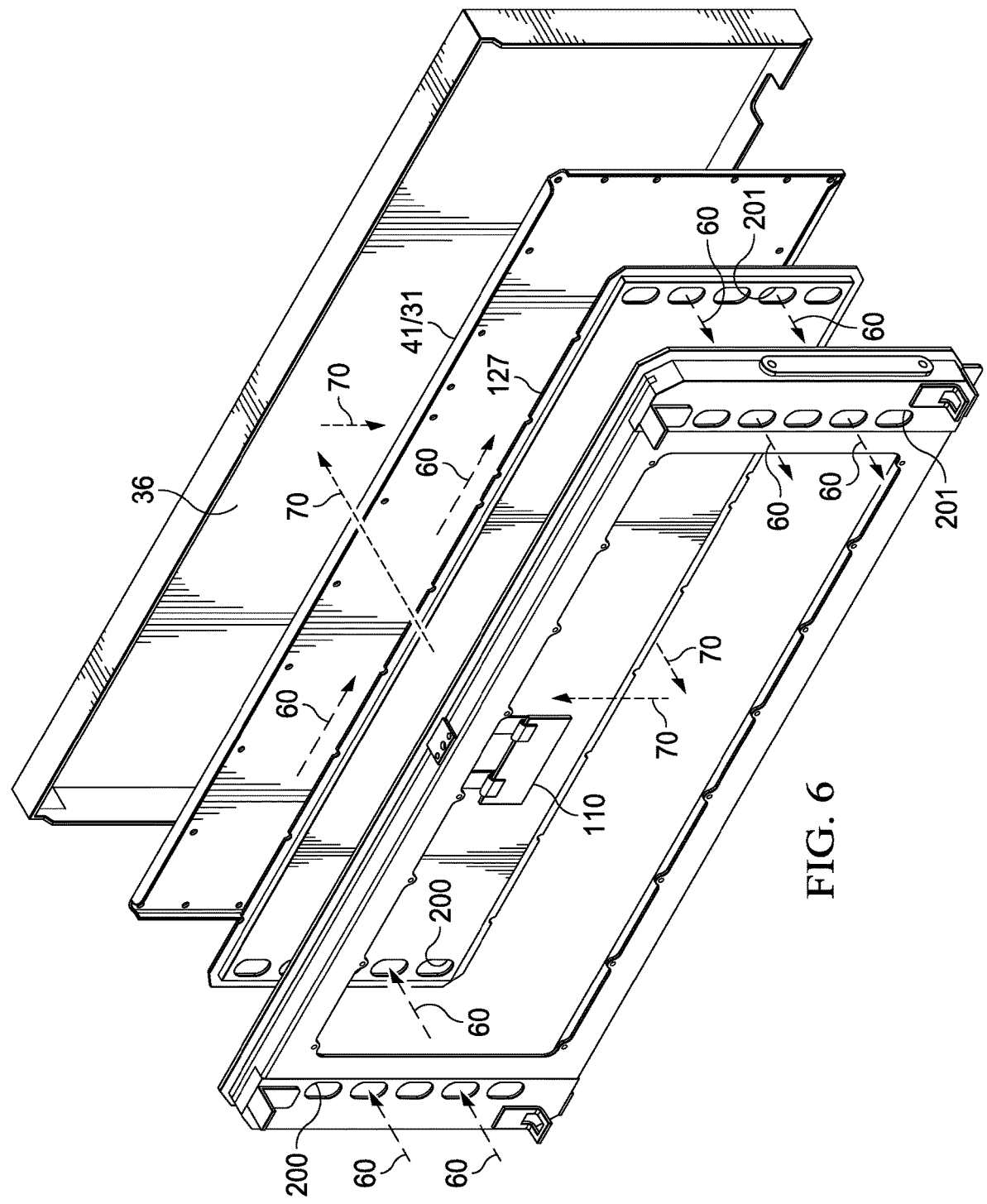
FIG. 6 is a partial exploded view of the embodiment shown in FIG. 1.

FIG. 6 is a partial exploded view of the embodiment shown in FIG. 1. This shows the stacking of the elements for one side of the assembly, i.e. the components surrounding electronic display 31. The ambient air 60 is preferably directed through the entrance apertures 200 so that it may pass between the thermal plate 127 and the rear of the electronic display 31 (in this embodiment, the rear surface of the LED backlight 41). Once passing through the open loop channel, the ambient air 60 is preferably directed out of an exit aperture 201 so that it can be collected in the exit plenum and exhausted out of the display housing. The circulating gas 70 generally encircles the open loop channel(s) having the ambient air 60. In other words, the open loop ambient air 60 passes through the center of the closed loop of circulating gas 70.

As noted above, the circulating gas 70 preferably passes over electronic components 110, exits the sealed electronics compartment 125, travels between the front transparent plate 36 and the front of the electronic display 31, eventually returning to the sealed electronics compartment 125. Again it should be noted that only one half of the embodiment is shown in this partial exploded view. Generally, there would be a second closed loop of circulating gas 70 travelling around the opposing display 30 and a second open loop channel for ambient air 60 passing behind the display 30, as shown and described above.

It should also be noted that the variety of open and closed cooling loops that are shown in the figures may be shown in a horizontal or vertical arrangement but it is clearly contemplated that this can be reversed or changed depending on the particular embodiment. Thus, the closed loop may run horizontally or vertically and in a clockwise or counter-clockwise direction. Further, the open loop may also be horizontal or vertical and can run left to right, right to left, and top to bottom, or bottom to top.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

What is claimed is:

1. A display assembly for mounting to a roof of a vehicle, the display assembly comprising:
    a housing adapted for mounting to the roof of the vehicle;
    a first electronic display and a second electronic display located at the housing;
    a first thermal plate positioned behind a rear surface of the first electronic display and comprising a first set of apertures vertically spaced apart along a first end of said first thermal plate and a second set of apertures vertically spaced apart along a second end of said first thermal plate;
    a second thermal plate positioned behind a rear surface of the second electronic display and comprising a third set of apertures vertically spaced apart along a first end of said second thermal plate and a fourth set of apertures vertically spaced apart along a second end of said second thermal plate;
    an inlet aperture located at a proximal end of said housing;
    an exhaust aperture located at a distal end of said housing;
    a first channel located between the first thermal plate and the rear surface of the first electronic display;
    a second channel located between the second thermal plate and the rear surface of the second electronic display; and
    one of more fans configured to, when activated, force ambient air through said inlet aperture, the first set of apertures in said first thermal plate and the third set of apertures in said second thermal plate, each of said first and second channels, the second set of apertures in said first thermal plate and said fourth set of apertures in said second thermal plate, and said exhaust aperture;
    wherein said inlet aperture, said first set of apertures in said first thermal plate, said second set of apertures in said first thermal plate, said third set of apertures in said second thermal plate, said fourth set of apertures in said second thermal plate, said first and second channels, and said exhaust aperture form at least part of an open loop; and
    wherein said open loop is configured to cause the ambient air to travel vertically through said inlet aperture, vertically along said first end of said first thermal plate and said first end of said second thermal plate, inward through the first set of apertures in said first thermal plate and said third set of apertures in said second thermal plate, horizontally along said second end of said first thermal plate and said second end of said second thermal plate, outward through the second set of apertures in said first thermal plate and said fourth set of apertures in said second thermal plate, and vertically through said exhaust aperture.

2. The display assembly of claim 1 wherein:
    said inlet aperture and said exhaust aperture are located at an upper panel of said housing.

3. The display assembly of claim 1 wherein:
    said first and second electronic displays each comprise a layer of liquid crystals and a backlight;
    said first channel extends along a rear surface of said backlight for said first electronic display; and
    said second channel extends along a rear surface of said backlight for said second electronic display.

4. The display assembly of claim 3 further comprising:
    a first cover panel located in front of said first electronic display;
    a second cover panel located in front of said second electronic display;
    a first front channel located between said first cover panel and said first electronic display;
    a second front channel located between said second cover panel and said second electronic display;
    a sealed electronics compartment located between said first and second thermal plates and said housing and in fluid communication with said first and second front channels;
    a closed loop comprising the first and second front channels and the sealed electronics compartment; and
    one or more closed loop fans located along said closed loop and configured to force circulating gas through said closed loop when activated.

5. The display assembly of claim 4 wherein:
    said closed loop encircles each of said first and second electronic displays.

6. The display assembly of claim 5 wherein:
said closed loop fans are located at a bottom portion of said housing.

7. The display assembly of claim 6 further comprising:
electronic components for operating said first and second electronic displays located at a rear surface of one or more of said first and second thermal plates.

8. The display assembly of claim 1 further comprising:
one or more feet extending from said housing to the roof of the vehicle, wherein each of said feet are configured to match a pitch of a section of said roof.

9. A display assembly for mounting to a roof of a vehicle, the display assembly comprising:
a housing adapted for mounting to the roof of the vehicle;
one or more feet extending from said housing to the roof of the vehicle;
a first electronic display and a second electronic display located at the housing in an opposing arrangement such that the first electronic display faces a first direction, and the second electronic display faces a second direction opposing the first direction;
a first thermal plate positioned behind a rear surface of the first electronic display;
a second thermal plate positioned behind a rear surface of the second electronic display;
an open loop pathway for ambient air comprising:
  an inlet aperture located at a first end of said housing for ingesting the ambient air;
  a first open loop channel located between, and extending along, the first thermal plate and the rear surface of the first electronic display;
  a second open loop channel located between, and extending along, the second thermal plate and the rear surface of the second electronic display;
  a first set of entrance apertures located at a first end of the first thermal plate and configured to provide fluid communication between the inlet aperture and the first open loop channel, wherein the first set of entrance apertures face in the first direction;
  a second set of entrance apertures located at a first end of the second thermal plate and configured to provide fluid communication between the inlet aperture and the second open loop channel, wherein the second set of entrance apertures lace in the second direction;
  an exhaust aperture located at a second end of said housing for exhausting the ambient air;
  a first set of exit apertures located at a second end of the first thermal plate and configured to provide fluid communication between the first open loop channel and the exhaust aperture, wherein the first set of exit apertures face in the first direction;
  a second set of exit apertures located at a second end of the second thermal plate and configured to provide fluid communication between the second open loop channel and the exhaust aperture, wherein the second set of exit apertures face in the second direction; and
  one or more open loop fans configured to, when activated, cause the ambient air to travel through said inlet aperture, each of said first and second set of entrance apertures, each of said first and second open loop channels, each of said first and second set of exit apertures, and said exhaust aperture; and
an electronics compartment located between the first and second thermal plates and configured to receive a flow of substantially particulate-free air.

10. The display assembly of claim 9 further comprising:
electronic components for operating said first and second electronic displays mounted to a rear surface of one or more of said first and second thermal plates.

11. The display assembly of claim 10 wherein:
said first set of entrance apertures, said first set of exit apertures, said second set of entrance apertures, and said second set of exit apertures are located outside of, and fluidly sealed from, said electronics compartment.

12. The display assembly of claim 11 wherein:
said first set of entrance apertures are vertically aligned and spaced apart;
said first set of exit apertures are vertically aligned and spaced apart;
said second set of entrance apertures are vertically aligned and spaced apart; and
said second set of exit apertures are vertically aligned and spaced apart.

13. The display assembly of claim 12 further comprising:
a first cover layer located in front of said first electronic display;
a second cover layer located in front of said second electronic display;
a first closed loop channel located between said first cover layer and said first electronic display;
a second closed loop channel located between said second cover layer and said second electronic display; and
a closed loop pathway comprising said first closed loop channel, said second closed loop channel, and said electronics compartment.

14. The display assembly of claim 13 wherein:
said first electronic display comprises a first layer of liquid crystals and a first backlight;
said second electronic display comprises a second layer of liquid crystals and a second backlight;
said first open loop channel extends along a rear surface of the first backlight; and
said second open loop channel extends along a rear surface of the second backlight.

15. The display assembly of claim 9 wherein:
each of the first set of entrance apertures are vertically aligned, spaced apart from one another, and located outside of, but adjacent to, the electronics compartment;
each of the second set of entrance apertures are vertically aligned and spaced apart from one another, and located outside of, but adjacent to, the electronics compartment;
each of the first set of exit apertures are vertically aligned and spaced apart from one another, and located outside of, but adjacent to, the electronics compartment; and
each of the second set of exit apertures are vertically aligned and spaced apart from one another, and located outside of, but adjacent to, the electronics compartment.

16. A display assembly for mounting to a roof of a vehicle, said display assembly comprising:
a housing adapted for mounting to the roof of the vehicle;
a first electronic display and a second electronic display located at the housing in a back to back arrangement;
a first thermal plate positioned adjacent to a rear surface of the first electronic display and comprising a first set of apertures spaced apart from one another vertically along a first end of said first thermal plate and a second set of apertures spaced apart from one another vertically along a second, opposing end of said first thermal plate;

a second thermal plate positioned adjacent to a rear surface of the second electronic display and comprising a third set of apertures spaced apart from one another vertically along a first end of said second thermal plate and a fourth set of apertures spaced apart from one another vertically along a second, opposing end of said second thermal plate;

an inlet aperture located at a proximal end of said housing;

an exhaust aperture located at a distal end of said housing;

one or more channels located between the thermal plates and the electronic displays and in fluid communication with said inlet aperture and said exhaust aperture by way of the apertures in the thermal plates;

one of more fans configured to, when activated, draw ambient air through said inlet aperture, each of the apertures in said thermal plates, each of said channels, and said exhaust aperture; and an electronics compartment located between the first and second thermal plates configured to maintain a flow of substantially particulate-free air;

wherein said first set of apertures and said second set of apertures in said first thermal plate as well as said third set of apertures and said fourth set of apertures in said second thermal plate are located outside of, but adjacent to, said electronics compartment;

wherein said one or more channels extend along a longitudinal axis of said housing to permit horizontal flow of the ambient air along said channels, said inlet aperture and said exhaust aperture are positioned on said housing to permit vertical distribution of the ambient air along said thermal plates, and said apertures in said thermal plates permit inward and outward flow of said ambient air between said channels and said inlet aperture or said exhaust aperture.

17. The display assembly of claim 16 further comprising:

a closed loop pathway comprising said electronics compartment and encircling each of the electronic displays.

18. The display assembly of claim 17 wherein:

each of said electronic displays comprise liquid crystal type displays.

* * * * *

UNITED STATES PATENT AND TRADEMARK OFFICE
CERTIFICATE OF CORRECTION

PATENT NO. : 11,744,036 B2
APPLICATION NO. : 17/025798
DATED : August 29, 2023
INVENTOR(S) : Marcos Diaz Page 1 of 1

It is certified that error appears in the above-identified patent and that said Letters Patent is hereby corrected as shown below:

In the Claims

In Column 7, Line 46, Claim 9, please delete "lace" and insert -- face --.

Signed and Sealed this
Twenty-seventh Day of August, 2024

Katherine Kelly Vidal
*Director of the United States Patent and Trademark Office*